(12) United States Patent
Schaefer et al.

(10) Patent No.: US 9,076,552 B2
(45) Date of Patent: Jul. 7, 2015

(54) DEVICE INCLUDING A DUAL PORT STATIC RANDOM ACCESS MEMORY CELL AND METHOD FOR THE FORMATION THEREOF

(71) Applicant: GLOBALFOUNDRIES Inc., Grand Cayman (KY)

(72) Inventors: Torsten Schaefer, Pulsnitz (DE); Dirk Fimmel, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 119 days.

(21) Appl. No.: 13/936,775

(22) Filed: Jul. 8, 2013

(65) Prior Publication Data
US 2015/0009750 A1    Jan. 8, 2015

(51) Int. Cl.
| G11C 11/00 | (2006.01) |
| G11C 11/412 | (2006.01) |
| H01L 27/11 | (2006.01) |
| G11C 8/16 | (2006.01) |

(52) U.S. Cl.
CPC ............. *G11C 11/412* (2013.01); *H01L 27/11* (2013.01); *G11C 8/16* (2013.01)

(58) Field of Classification Search
CPC ............. G11C 11/412; G11C 27/1104; G11C 11/4125

USPC ............................. 365/156, 154, 230.05, 49.1
See application file for complete search history.

(56) References Cited

U.S. PATENT DOCUMENTS

| 8,009,463 B2 | 8/2011 | Liaw | |
| 8,183,639 B2 * | 5/2012 | Malinge et al. | 257/368 |
| 8,189,368 B2 | 5/2012 | Liaw | |
| 8,675,397 B2 * | 3/2014 | Liaw | 365/154 |

* cited by examiner

*Primary Examiner* — Son Dinh
(74) *Attorney, Agent, or Firm* — Amerson Law Firm, PLLC

(57) ABSTRACT

A device includes a substrate and a dual port static random access memory cell. The substrate includes an N-well region, a first P-well region and a second P-well region. The first and second P-well regions are arranged on opposite sides of the N-well region and spaced apart along a width direction. The static random access memory cell includes first and second pull-up transistors that are provided in the N-well region, a first pair of pull-down transistors and a first pair of access transistors provided in the first P-well region, and a second pair of pull-down transistors and a second pair of access transistors provided in the second P-well region. Each of the first pair and the second pair of pull-down transistors includes a first pull-down transistor and a second pull-down transistor. Active regions of the first pull-down transistor and the second pull-down transistor are spaced apart along the width direction.

20 Claims, 4 Drawing Sheets

DEVICE INCLUDING A DUAL PORT STATIC RANDOM ACCESS MEMORY CELL AND METHOD FOR THE FORMATION THEREOF

BACKGROUND OF THE INVENTION

1. Field of the Invention

Generally, the present disclosure relates to the field of integrated circuits, and, more particularly, to integrated circuits including static random access memory devices.

2. Description of the Related Art

Types of semiconductor memory include dynamic random access memory (DRAM) and static random access memory (SRAM). DRAM includes memory cells having a relatively simple structure, in particular memory cells wherein an amount of charge stored in a capacity is used to represent a bit of information. Due to the simple structure of DRAM cells, a high density of integration may be obtained. However, due to leakage currents in the capacities, DRAM typically requires constant refresh cycles to avoid a loss of information.

In SRAM devices, cross-coupled inverters are used for storing information. In SRAM devices, refresh cycles need not be performed, and they typically allow a greater speed of operation than DRAM devices. However, SRAM includes memory cells which typically have a more complex structure than the memory cells of DRAM devices, which may limit the density of integration of SRAM devices that may be obtained.

SRAM devices include an array of SRAM cells, wherein each SRAM cell can store one bit of information. In addition to single port SRAM cells, types of SRAM cells that may be used in SRAM devices include dual port SRAM cells, wherein each SRAM cell has two ports. The two ports of each SRAM cell can allow simultaneous reading of the bit stored in the SRAM cell from both ports. Moreover, in some situations, a read operation of a first SRAM cell may be performed simultaneously with a write operation on a second SRAM cell.

A layout of a conventional dual port SRAM cell 100 will be described with reference to FIG. 1. The dual port SRAM cell 100 may be provided in and/or on a P-doped substrate 101, wherein an N-well region 102 and two P-well regions 103, 104 are formed. The P-well regions 103, 104 are provided on opposite sides of the N-well region 102. The N-well region 102 and the P-well regions 103, 104 may be provided in a semiconductor material, for example silicon, of the substrate 101, wherein the N-well region 102 is doped with an N-type dopant, and the P-well regions 103, 104 are doped with a P-type dopant.

In the N-well region 102, active regions 105, 106 of a first pull-up transistor 107 and a second pull-up transistor 108, respectively, are formed. In the first P-well region 103, a first pull-down transistor 109 is provided at an active region 110. In the second P-well region 104, a second pull-down transistor 111 is provided at an active region 112.

Gate electrodes of the first pull-up transistor 107 and the first pull-down transistor 109 are provided by a line 113 of an electrically conductive material, for example doped polysilicon that is electrically connected to a drain region of the second pull-up transistor 108 by a contact structure 114. Gate electrodes of the second pull-up transistor 108 and the second pull-down transistor 111 are provided by an electrically conductive line 115 that is electrically connected to a drain area of the first pull-up transistor 107 by a contact structure 116. Metallization lines 117, 118 and contact structures 114, 116, 119, 120 provide an electrical connection between the drains of the pull-up transistors 107, 108 and their associated pull-down transistors 109, 111.

Source areas of the pull-up transistors 107, 108 may be electrically connected to a high voltage power supply line (not shown) by contact structures 121, 122, and source regions of the pull-down transistors 109, 111 may be electrically connected to a low voltage power supply line (not shown) by contact structures 123, 124.

For reading data from and writing data to the dual port SRAM cell 100, access transistors 125, 126 may be provided in the first P-well region 103 and access transistors 127, 128 may be provided in the second P-well region 104. Gate electrodes of the access transistors 125, 126 are provided by an electrically conductive line 129, and gate electrodes of the access transistors 127, 128 are provided by an electrically conductive line 130.

The access transistor 125 may be formed at the same active region 110 as the first pull-down transistor 109. The access transistor 127 may be formed at the same active region 112 as the second pull-down transistor 111. The access transistor 126 may be provided at an active region 131, and the access transistor 128 may be provided at an active region 132. An isolation structure 133, for example a shallow trench isolation structure, may provide electrical insulation between the active regions 107, 108, 110, 112, 131, 132.

The access transistor 125 has one source/drain region that is contiguous with the drain region of the first pull-down transistor 109. The other source/drain region of the access transistor 125 is electrically connected to a first bitline (not shown) by a contact structure 134. One source/drain region of the access transistor 126 may be electrically connected to the drain region of the second pull-down transistor 111 by a contact structure 135, the electrically conductive line 113, the contact structure 114, the metallization line 117 and the contact structure 119. The other source/drain region of the access transistor 126 may be electrically connected to a first inverse bitline (not shown) by a contact structure 136. The electrically conductive line 129 providing the gate electrodes of the access transistors 125, 126 may be electrically connected to a first wordline (not shown) via contact structure 137.

The access transistors 125, 126 provide a first port of the dual port SRAM cell 100. For reading data from the dual port SRAM cell 100 or writing data to the dual port SRAM cell 100 through the first port, the access transistors 125, 126 may be switched into an electrically conductive state by applying an appropriate signal to the first wordline, and a bit signal and an inverse bit signal, respectively, may be read from the first bitline and the first inverse bitline, or written to the first bitline and the first inverse bitline.

One source/drain region of the access transistor 127 may be contiguous with the drain region of the second pull-down transistor 111, and the other source/drain region of the access transistor 127 may be electrically connected to a second inverse bitline (not shown) by a contact structure 138. One source/drain region of the access transistor 128 may be electrically connected to the drain region of the first pull-down transistor 109 by a contact structure 139, the electrically conductive line 115, the contact structure 116, the metallization line 118 and the contact structure 120. The other source/drain region of the access transistor 128 may be electrically connected to a second bitline (not shown) by a contact structure 140. The electrically conductive line 130 providing the gate electrodes of the access transistors 127, 128 may be electrically connected to a second wordline by a contact structure 141.

The access transistors 127, 128 provide a second port of the dual port SRAM cell 100. Data may be read from and written to the dual port SRAM cell 100 through the second port by applying an appropriate wordline signal to the second wordline, and by reading bit signals and inverse bit signals from the second bitline and the second inverse bitline, or writing bit signals and inverse bit signals to the second bitline and the second inverse bitline.

The source and drain regions of the pull-up transistors 107, 108 may be doped inversely to the doping of the N-well region 102, i.e., P-doped. Thus, the pull-up transistors 107, 108 are P-channel transistors. The source and drain regions of the pull-down transistors 109, 111 and the source/drain regions of the access transistors 125, 126, 127, 128 may be doped inversely to the doping of the P-well regions 103, 104, i.e., N-doped, so that the pull-down transistors 109, 111 and the access transistors 125, 126, 127, 128 are N-channel transistors.

As can be seen from FIG. 1, a channel width of the pull-down transistors 109, 111, the channel width being an extension of the channel region in a direction (horizontal in the view of FIG. 1) that is perpendicular to a channel length direction from the source region to the drain region may be greater than channel widths of the other transistors of the dual port SRAM cell 100. In particular, the channel width of the pull-down transistors 109, 111 may be greater than the channel width of the access transistors 125, 127 which are formed at the same active regions 110, 112 as the pull-down transistors 109, 111. Thus, parallel operation of the dual port SRAM cell 100 via the two ports of the dual port SRAM cell 100, which may entail a relatively high current through the pull-down transistors, may be supported.

Due to optical effects occurring in the formation of dual port SRAM cell 100 by means of techniques of photolithography, the greater width of the portions of the active regions 110, 112 wherein the pull-down transistors 109, 111 are provided may entail a different effective width of the portions of the active regions 110, 112 wherein the access transistors 125, 127 are formed.

Therefore, the access transistors 125, 127 may obtain a different channel width than the access transistors 126, 128, so that the electrical parameters of the pairs of access transistors providing the two ports of the dual port SRAM cell 100 do not match.

For addressing this issue, in U.S. Pat. Nos. 8,009,463 and 8,189,368, it has been proposed to provide a different layout of dual port SRAM cells. In this layout, pairs of pull-down transistors are provided instead of each of the pull-down transistors 109, 111 described above. However, in the layout proposed in U.S. Pat. No. 8,009,463 and U.S. Pat. No. 8,189,368, electrically conductive lines providing gate electrodes of the pull-up transistors and the pairs of the pull-down transistors have a relatively complex shape including U-shaped portions that provide the gate electrodes of the pairs of pull-down transistors. This complex shape of electrically conductive lines may make manufacturing of the electrically conductive lines difficult, in particular in SRAM devices wherein small feature sizes are employed.

In view of the situation described above, the present disclosure is related to a device and a method wherein some or all of the above-mentioned issues are overcome substantially completely or at least partially.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative device disclosed herein includes a substrate and a dual port static random access memory cell. The substrate includes an N-well region, a first P-well region and a second P-well region. The first and second P-well regions are arranged on opposite sides of the N-well region and spaced apart along a width direction. The dual port static random access memory cell includes a first pull-up transistor and a second pull-up transistor provided in the N-well region, a first pair of pull-down transistors and a first pair of access transistors provided in the first P-well region, and a second pair of pull-down transistors and a second pair of access transistors provided in the second P-well region. Each of the first pair of pull-down transistors and the second pair of pull-down transistors includes a first pull-down transistor and a second pull-down transistor. An active region of the first pull-down transistor and an active region of the second pull-down transistor are spaced apart along the width direction.

An illustrative method disclosed herein includes providing a semiconductor substrate. A dual port static random access memory cell is formed. The formation of the dual port static random access memory cell includes forming an N-well region, a first P-well region and a second P-well region in the substrate. The first and second P-well regions are arranged on opposite sides of the N-well region and spaced apart along a width direction. A first pull-up transistor and a second pull-up transistor are formed in the N-well region. A first pair of pull-down transistors and a first pair of access transistors are formed in the first P-well region. A second pair of pull-down transistors and a second pair of access transistors are formed in the second P-well region. Each of the first pair of pull-down transistors and the second pair of pull-down transistors includes a first pull-down transistor and a second pull-down transistor. An active region of the first pull-down transistor and an active region of the second pull-down transistor are spaced apart along the width direction.

BRIEF DESCRIPTION OF THE DRAWINGS

The disclosure may be understood by reference to the following description taken in conjunction with the accompanying drawings, in which like reference numerals identify like elements, and in which.

Figure 1:
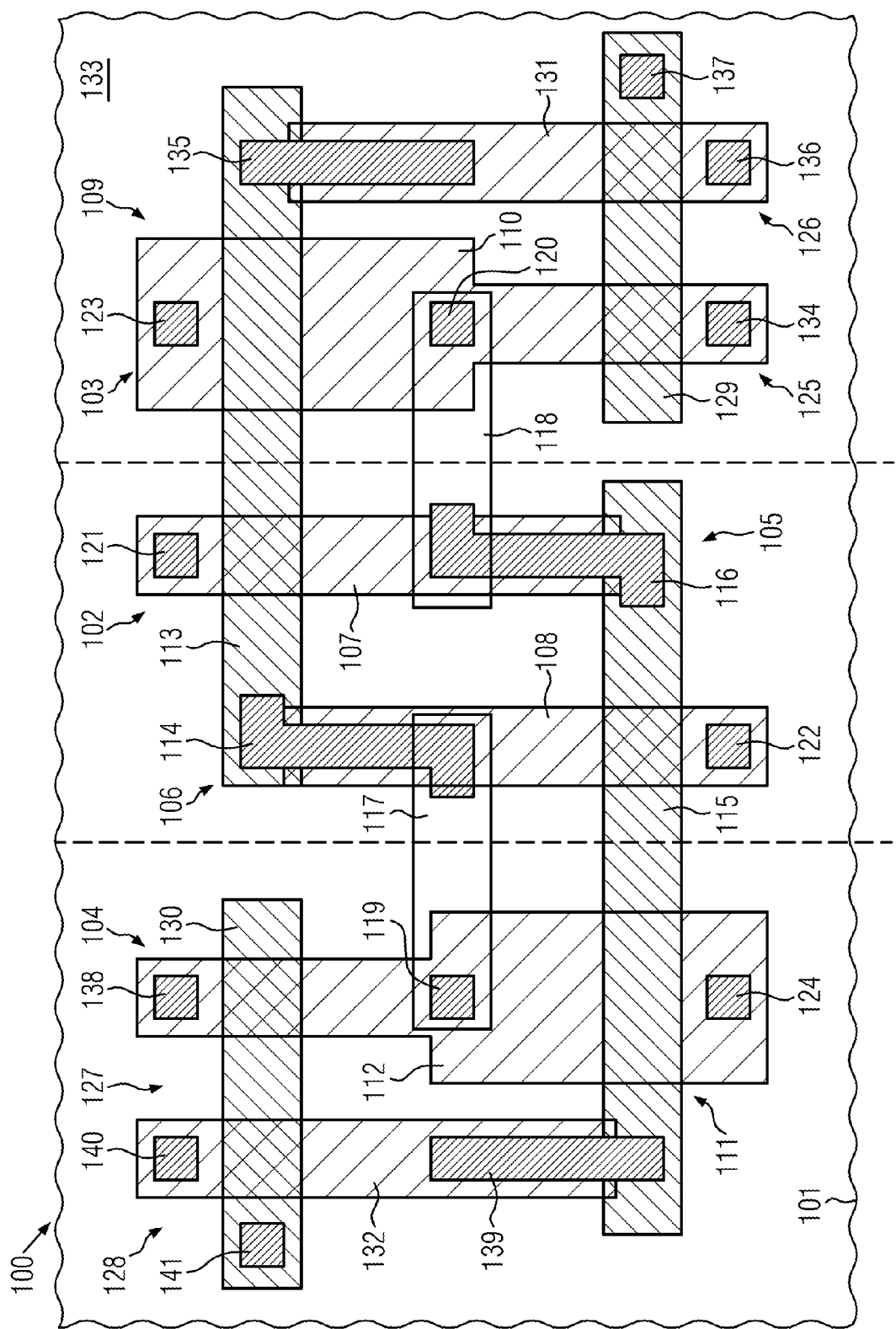
FIG. 1 schematically illustrates a conventional dual port SRAM cell.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2:
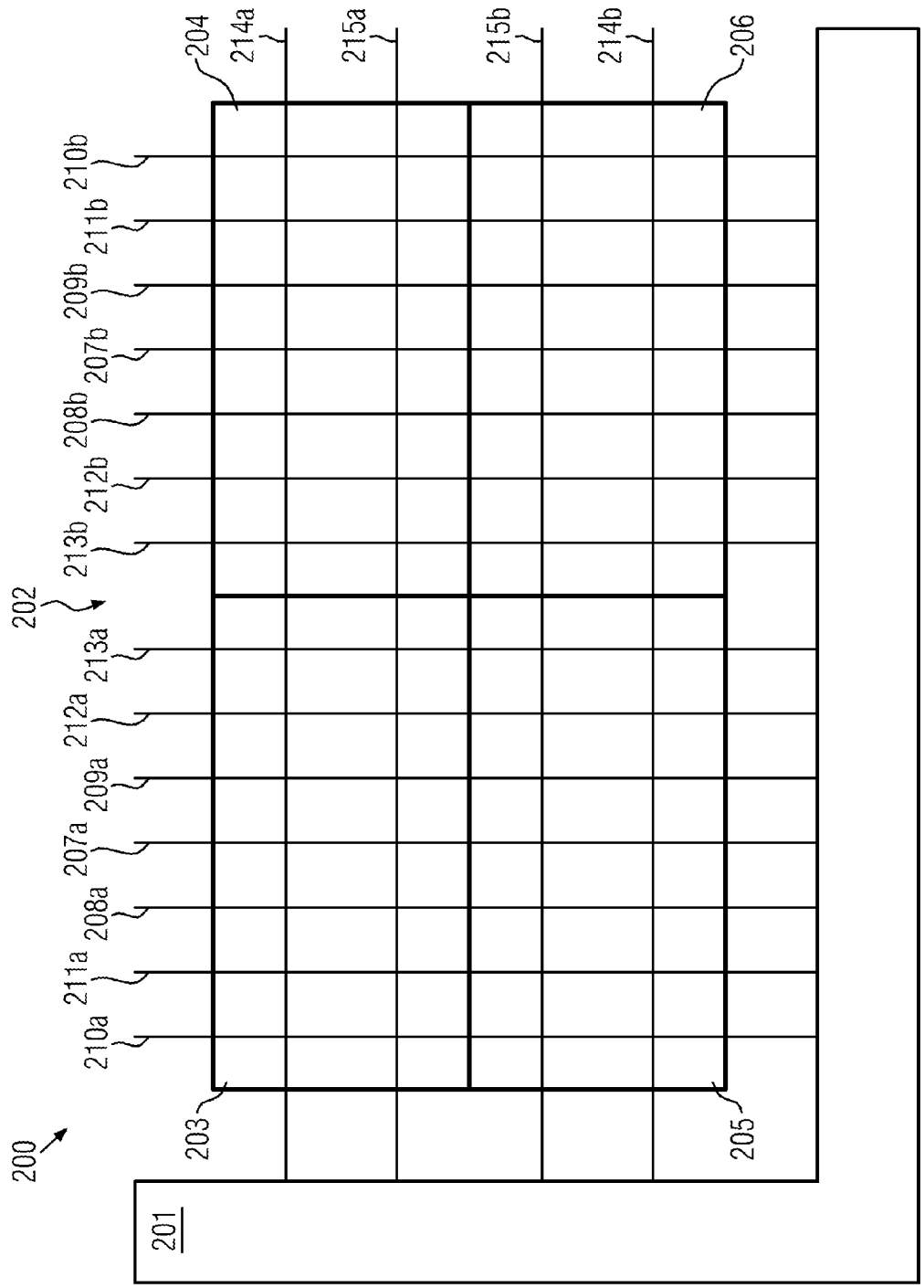
FIG. 2 shows a schematic view of an SRAM device according to an embodiment.

FIG. 2 schematically illustrates an SRAM device 200 according to an embodiment. The SRAM device 200 may be provided in an integrated circuit, for example in an integrated circuit additionally including a central processing unit (CPU), wherein the SRAM device 200 may be used as a cache memory. In other embodiments, the SRAM device 200 may be provided in a separate SRAM memory chip. In further embodiments, the SRAM device may be provided in a system-on-a-chip device.

The SRAM device 200 includes a control circuit 201 and a plurality of dual port static random access memory cells 203, 204, 205, 206. In FIG. 2, for simplicity, four dual port SRAM cells 203, 204, 205, 206 are shown. In embodiments, a number of dual port SRAM cells greater than four may be provided in the SRAM device.

The plurality of dual port SRAM cells 203, 204, 205, 206 may be arranged in an array 202, wherein dual port SRAM cells 203, 204 are located in a first row of the array 202, and dual port SRAM cells 205, 206 are located in a second row of the array 202. Dual port SRAM cells 203, 205 are located in a first column of the array, and dual port SRAM cells 204, 206 are located in a second column of the array.

The arrangement of rows and columns of the dual port SRAM cells 203, 204, 205, 206 in the array 202 defines a width direction and a length direction of the SRAM device 200, wherein the rows of dual port SRAM cells 203, 204, 205, 206 extend along the width direction and the columns of dual port SRAM cells 203, 204, 205, 206 extend along the length direction. In the view of FIG. 2 as well as in the view of FIG. 4, which will be discussed in more detail below, the width direction of the SRAM device 200 is horizontal, and the length direction is vertical.

The SRAM device 200 includes high voltage power supply lines 207a, 207b, which extend substantially along the length direction of the SRAM device 200 and substantially perpendicularly to the width direction. Furthermore, the SRAM device 200 includes low voltage power supply lines 208a, 209a, 208b, 209b, extending substantially along the length direction of the SRAM device 200 and substantially perpendicularly to the width direction.

In the operation of the SRAM device 200, an operating voltage of the SRAM device 200 may be applied between the high voltage power supply lines 207a, 207b and the low voltage power supply lines 208a, 209a, 208b, 209b, wherein the electrical potential of the low voltage power supply lines 208a, 209a, 208b, 209b is lower than the electrical potential of the high voltage power supply lines 207a, 207b. In some embodiments, the low voltage power supply lines 208a, 209a, 208b, 209b may be connected to mass potential. In some embodiments, the voltages applied to the high voltage power supply lines 207a, 207b and the low voltage power supply lines 208a, 209a, 208b, 209b may be provided by the control circuit 201.

The SRAM device 200 further includes a plurality of first bitlines 210a, 210b, second bitlines 211a, 211b, first inverse bitlines 212a, 212b and second inverse bitlines 213a, 213b.

The bitlines 210a, 211a, 210b, 211b, and the inverse bitlines 212a, 213a, 212b, 213b extend substantially along the length direction of the semiconductor device 200 and substantially perpendicularly to the width direction. For each column of the array 202 of dual port SRAM cells 203, 204, 205, 206, two bitlines and two inverse bitlines are provided. In particular, for the first column of the array of dual port SRAM cells that includes dual port SRAM cells 203, 205, bitlines 210a, 211a and inverse bitlines 212a, 213a are provided, and for the second column of the array of dual port SRAM cells that includes dual port SRAM cells 204, 206, bitlines 210b, 211b and inverse bitlines 212b, 213b are provided.

The bitlines 210a, 211a, 210b, 211b and inverse bitlines 212a, 213a, 212b, 213b may be electrically connected to the control circuit 201. The control circuit 201 may apply bitline signals to the bitlines 210a, 211a, 210b, 211b, and inverse bitline signals to the inverse bitlines 212a, 213a, 212b, 213b for writing data to the array 202 of dual-port SRAM cells 203, 204, 205, 206, and may read bitline signals and inverse bitline signals from the bitlines 210a, 211a, 210b, 211b and the inverse bitlines 212a, 213a, 212b, 213b, respectively, for reading data from the array 202 of dual-port SRAM cells 203, 204, 205, 206.

The SRAM device 200 further includes first wordlines 214a, 214b and second wordlines 215a, 215b. For each row of the array of dual port SRAM cells, two wordlines are provided. In particular, the first row of the array 202 of dual port SRAM cells includes wordlines 214a, 215a, and the second row of the array 202 of dual port SRAM cells includes wordlines 214b, 215b.

The arrangement of the bitlines 210b, 211b relative to the inverse bitlines 212b, 213b may be mirror-symmetrical compared to the arrangement of the bitlines 210a, 211a relative to the inverse bitlines 212a, 213a. Thus, in the view of FIG. 2, inverse bitlines 212a, 213a are to the right of bitlines 210a, 211a, and inverse bitlines 212b, 213b are to the left of bitlines 210b, 211b. Similarly, the relative arrangement of wordlines 214b, 215b may be mirror-symmetrical to the relative arrangement of the wordlines 214a, 215a. The mirror-symmetrical arrangement of the bitlines and inverse bitlines in adjacent columns of the array 202 of dual port SRAM cells and the mirror-symmetrical arrangement of the first and second wordlines in adjacent rows of the array 202 of dual-port SRAM cells may correspond to a mirror-symmetrical layout of the dual port memory cells in adjacent columns and rows, as will be described below.

The wordlines 214a, 215a, 214b, 215b are connected to the control circuit 201. The control circuit 201 may apply wordline signals to the wordlines 214a, 215a, 214b, 215b.

Figure 3:
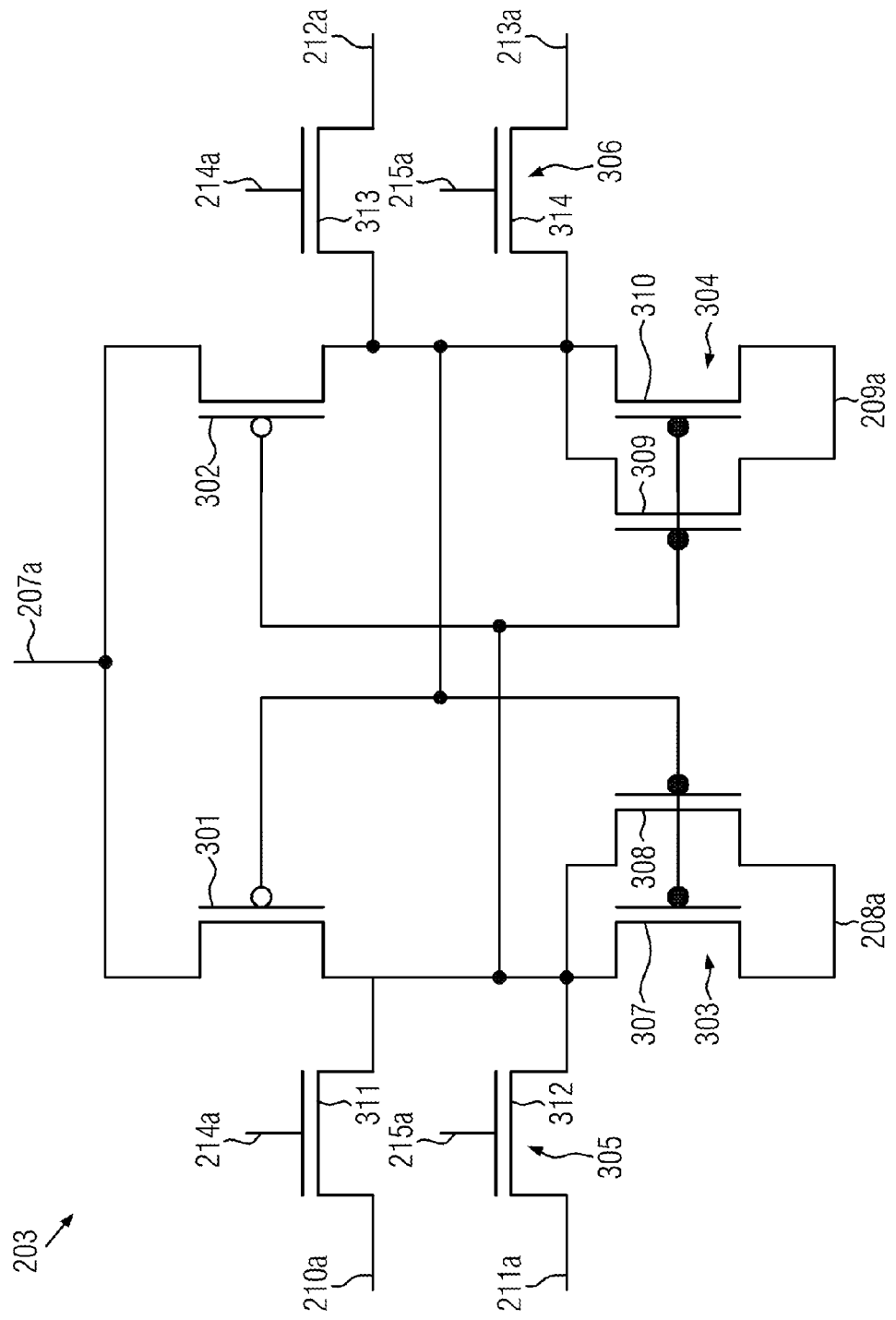
FIG. 3 shows a schematic circuit diagram of a dual-port SRAM cell in the device shown in FIG. 2.

FIG. 3 shows a schematic circuit diagram of dual port SRAM cell 203. The dual port SRAM cell 203 includes a first pull-up transistor 301 and a second pull-up transistor 302, wherein the pull-up transistors 301, 302 may be P-channel field effect transistors.

The dual port SRAM cell 203 further includes a first pair 303 of pull-down transistors and a second pair 304 of pull-down transistors. Each of the pairs 303, 304 of pull-down transistors includes a first and a second pull-down transistor. In particular, the first pair 303 of pull-down transistors includes a first pull-down transistor 307 and a second pull-down transistor 308, and the second pair 304 of pull-down transistors includes a first pull-down transistor 309 and a second pull-down transistor 310. Each of the pull-down transistors 307, 308, 309, 310 may be an N-channel field effect transistor.

Source regions of the pull-up transistors 301, 302 are electrically connected to the high voltage power supply line 207a extending through the dual port SRAM cell 203. The pull-down transistors 307, 308 of the first pair 303 of pull-down transistors are electrically connected in parallel between the drain of the first pull-up transistor 301 and the first low voltage power supply line 208a, wherein source regions of the pull-down transistors 307, 308 are electrically connected to the first low voltage power supply line 208a, and drain regions of the pull-down transistors 307, 308 are electrically connected to the drain region of the first pull-up transistor 301.

The pull-down transistors 309, 310 of the second pair 304 of pull-down transistors are electrically connected in parallel between the drain of the second pull-up transistor 302 and the second low voltage power supply line 209a. Sources of the pull-down transistors 309, 310 are electrically connected to the second low voltage power supply line 209a, and the drains of the pull-down transistors 309, 310 are connected to the drain of the second pull-up transistor 302.

The gate electrodes of the pull-down transistors 307, 308 of the first pair 303 of pull-down transistors are electrically connected to each other, to the gate electrode of the first pull-up transistor 301 and the drain region of the second pull-up transistor 302. Similarly, the gate electrode of the pull-down transistors 309, 310 of the second pair 304 of pull-down transistors are electrically connected to each other, to the gate electrode of the second pull-up transistor 302 and to the drain of the first pull-up transistor 301.

The first pull-up transistor 301 and the first pair 303 of pull-down transistors provide a first inverter, and the second pull-up transistor 302 and the second pair 304 of pull-down transistors provide a second inverter. The first and second inverters are cross-connected to each other.

The dual port SRAM cell 203 further includes a first pair 305 of access transistors and a second pair 306 of access transistors. The first pair 305 of access transistors includes a first access transistor 311 and a second access transistor 312. Similarly, the second pair 306 of access transistors includes a first access transistor 313 and a second access transistor 314. Each of the access transistors 311, 312, 313, 314 of the first 305 and second 306 pair of access transistors has two source/drain regions, wherein the term "source/drain region" is used to indicate that each of the source/drain regions can function as a source or a drain, depending on the state of the dual port SRAM cell 203 and the type of operation that is performed, such as reading data from the dual port SRAM cell 203 and/or writing data to the dual port SRAM cell 203.

A first source/drain region of the first access transistor 311 of the first pair 305 of access transistors is electrically connected to the drain regions of the first pull-up transistor 301 and the pull-down transistors 307, 308 of the first pair 303 of pull-down transistors. The second source/drain region of the first access transistor 311 of the first pair 305 of access transistors is electrically connected to the first bitline 210a, and its gate electrode is electrically connected to the first wordline 214a.

A first source/drain region of the second access transistor 312 of the first pair 305 of access transistors is electrically connected to the drain regions of the first pull-up transistor 301 and the pull-down transistors 307, 308 of the first pair 303 of pull-down transistors. The second source/drain region is electrically connected to the second bitline 211a, and its gate electrode is electrically connected to the second wordline 215a.

A first source/drain region of the first access transistor 313 of the second pair 306 of access transistors is electrically connected to drain regions of the second pull-up transistor 302 and the pull-down transistors 309, 310 of the second pair 304 of pull-down transistors. The second source/drain region is electrically connected to the first inverse bitline 212a, and its gate electrode is electrically connected to the first wordline 214a.

A first source/drain region of the second access transistor 314 of the second pair 306 of access transistors is electrically connected to the drain regions of the second pull-up transistor 302 and the pull-down transistors 309, 310 of the second pair 304 of pull-down transistors. The second source/drain region is electrically connected to the second inverse bitline 213a, and its gate electrode is electrically connected to the second wordline 215a.

The first access transistors 311, 313 of the pairs 305, 306 of access transistors provide a first port of the dual port SRAM cell 203. The first access transistors 311, 313 may be switched into an electrically conductive state by applying a wordline signal to the first wordline 214a. Then, data can be read from the dual port SRAM cell 203 or written to the dual port SRAM cell 203 via the first bitline 210a and the first inverse bitline 212a.

The second access transistors 312, 314 of the pairs 305, 306 of access transistors provide a second port of the dual port SRAM cell 203. The second access transistors 312, 314 may be switched into an electrically conductive state by applying a wordline signal to the second wordline 215a. Then, data can be read from or written to the dual port SRAM cell 203 via the second bitline 211a and the second inverse bitline 213a.

Reading data from the dual port SRAM cell 203 and/or writing data to the dual port SRAM cell 203 may be performed in accordance with conventional techniques for reading data from SRAM cells and/or writing data to SRAM cells. The signals applied to the wordlines 214a, 215a, the bitlines 210a, 211a and the inverse bitlines 212a, 213a in the read and write operations may be provided by the control circuit 201.

The access transistors 311, 312, 313, 314 of the pairs 305, 306 of access transistors may be N-channel field effect transistors.

The circuit configuration of the other dual port SRAM cells 204, 205, 206 of the SRAM device 200 may correspond to the circuit configuration of the dual port SRAM cell 203 described above, wherein the second source/drain regions of the access transistors of the pairs of access transistors are electrically connected to the bitlines and inverse bitlines of the column of the array 202 of dual port SRAM cells of the SRAM device 200 wherein the respective dual port SRAM cell is provided, and the gate electrodes of the access transistors of the pairs of access transistors are electrically connected to the wordlines of the row of the array 202 of dual port SRAM cells of the SRAM device 200 wherein the respective dual port SRAM cell is provided.

Figure 4:
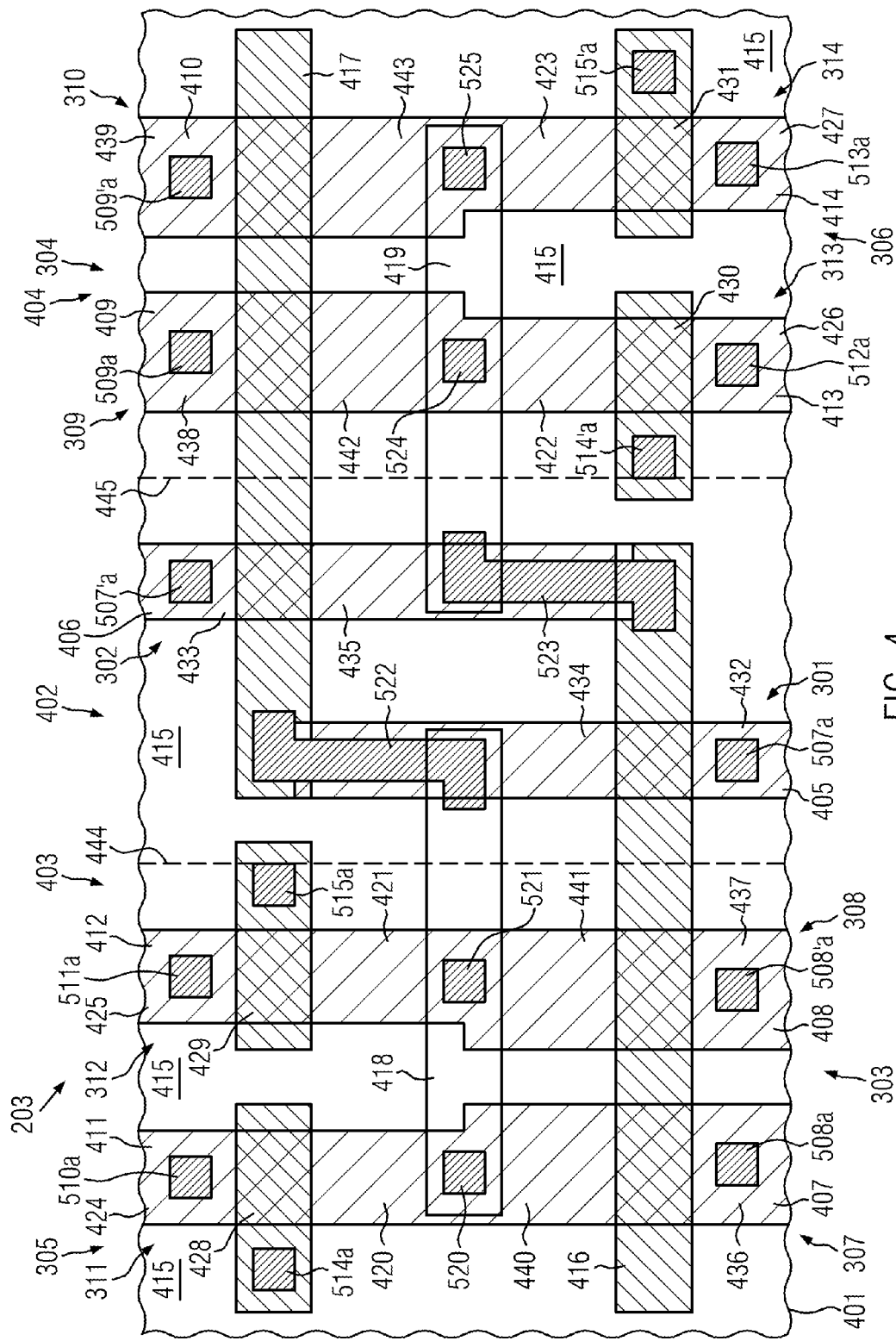
FIG. 4 shows a schematic view of a layout of a dual port SRAM cell in the device shown in FIG. 2.

FIG. 4 shows a schematic illustration of a circuit layout according to an embodiment of the dual port SRAM cell 203. The orientation of the plane of drawing of FIG. 4 corresponds to the orientation of the plane of drawing of FIG. 2, so that the width direction of the SRAM device 200 is horizontal and the longitudinal direction of the SRAM device 200 is vertical.

The SRAM device 200 may be formed in and on a substrate 401. The substrate 401 may be a bulk substrate of a semiconductor material, for example a silicon wafer or die. Alternatively, the substrate 401 may be a semiconductor-on-insulator substrate including a layer of a semiconductor material, for example silicon, in and on which the circuit elements of the SRAM device 200 are formed. The layer of semiconductor material may be provided on a layer of electrically insulating material, for example silicon dioxide. The layer of electrically insulating material may be provided on a support substrate, which may be a silicon wafer or die.

Each of the dual port SRAM cells 203, 204, 205, 206 of the array 202 of SRAM cells may be formed in and on a portion of the substrate 401. The control circuit 201 and further circuitry, for example a CPU and/or other arrays of SRAM and/or DRAM memory cells, may be formed in and on the same substrate 401.

In FIG. 4, reference numeral 402 denotes an N-well region of the substrate 401, and reference numerals 403, 404 denote a first P-well region and a second P-well region, respectively. Boundaries between the N-well region 402 and the P-well regions 403, 404 are denoted by dashed lines 444, 445.

The N-well region 402 may be formed by introducing an N-type dopant into the semiconductor material of the substrate 401, for example by means of an ion implantation process. The concentration of the N-type dopant in the N-well region 402 may correspond to dopant concentrations conventionally employed in channel regions of P-channel field effect transistors.

The first 403 and second 404 P-well region may be formed by introducing a P-type dopant into the semiconductor material of the substrate 401, for example by means of an ion implantation process. The concentration of the P-type dopant in the P-well regions 403, 404 may correspond to dopant concentrations conventionally employed in the channel regions of N-channel field effect transistors.

The N-well region 402 and the first 403 and second 404 P-well regions may extend through the column of dual port SRAM cells wherein the dual port SRAM cell 203 is provided along the longitudinal direction of the SRAM device 200. In particular, the N-well region 402 and the P-well regions 403, 404 may extend both through the dual port SRAM cell 203 and through the dual port SRAM cell 205 that is adjacent the dual port SRAM cell 203 and arranged in the same column of the array 202 of dual port SRAM cells.

In other columns of the array 202 of dual port SRAM cells of the SRAM device 200, N-well regions similar to the N-well region 402 may be provided. In particular, an N-well region may extend through the column of dual port SRAM cells including the dual port SRAM cells 204, 206 along the longitudinal direction of the SRAM device 200. Furthermore, in each of the columns of the array 202 of dual port SRAM cells of the SRAM device, P-well regions similar to P-well regions 403, 404 may be provided that extend through the column of dual port SRAM cells along the longitudinal direction of the SRAM device 200, wherein adjacent P-well regions in adjacent columns may be contiguous with each other.

The first P-well region 403 and the second P-well region 404 are arranged on opposite sides of the N-well region 402, so that the N-well region 402 is between the first P-well region 403 and the second P-well region 404. The first P-well region 403 and the second P-well region 404 are spaced apart from each other by the N-well region 402 along the width direction of the SRAM device 200.

The pull-up transistors 301, 302 of the dual port SRAM cell 203 are provided at the N-well region 402. The pull-down transistors 307, 308 of the first pair 303 of pull-down transistors and the access transistors 311, 312 of the first pair 305 of access transistors are provided at the first P-well region 403. The pull-down transistors 309, 310 of the second pair 304 of pull-down transistors are provided at the second P-well region 404.

In FIG. 4, reference numeral 405 denotes an active region of the first pull-up transistor 301, and reference numeral 406 denotes an active region of the second pull-up transistor 302. Reference numerals 407, 408 denote active regions of the pull-down transistors 307, 308 of the first pair 303 of pull-down transistors, and reference numerals 409, 410 denote active regions of the pull-down transistors 309, 310 of the second pair 304 of pull-down transistors. Reference numerals 411, 412 denote active regions of the access transistors 311, 312 of the first pair 305 of access transistors, and reference numerals 413, 414 denote active regions of the access transistors 313, 314 of the second pair 306 of access transistors.

A first electrically conductive line 416 extending substantially parallel to the width direction of the SRAM device 200 provides gate electrodes of the first pull-up transistor 301 and the pull-down transistors 307, 308 of the first pair 303 of pull-down transistors. The first electrically conductive line 416 may be formed of an electrically conductive material, for example doped polysilicon and/or one or more metals, and may be separated from the active regions 405, 407, 408 of the first pull-up transistor 301 and the pull-down transistors 307, 308 of the first pair 303 of pull-down transistors by a gate insulation layer (not shown) formed of an electrically insulating gate insulation material such as, for example, silicon dioxide and/or a high-k material such as hafnium oxide. Channel regions of the first pull-up transistor 301 and the pull-down transistors 307, 308 of the first pair 303 of pull-down transistors are provided below the first electrically conductive line 416.

Adjacent the channel region of the first pull-up transistor 301, a source region 432 and a drain region 434 are provided. A doping of the channel region of the first pull-up transistor 301 may correspond to the N-type doping of the N-well region 402 and the source and drain regions 432, 434 of the first pull-up transistor 301 may be P-doped.

The channel regions of the pull-down transistors 307, 308 provided below the first electrically conductive line 416 may be P-doped, in accordance with the P-type doping of the P-well region 403, and source regions 436, 437 and drain regions 440, 441 of the pull-down transistors 307, 308 may be N-doped.

The dual port SRAM cell 203 further includes a second electrically conductive line 417. The second electrically conductive line 417 extends substantially parallel to the width direction of the SRAM device 200 and provides gate electrodes of the second pull-up transistor 302 and the pull-down transistors 309, 310 of the second pair 304 of pull-down transistors. The second electrically conductive line 417 may be electrically insulated from the active regions 406, 409, 410 of the second pull-up transistor 302 and the pull-down transistors 309, 310 by a gate insulation layer (not shown). Further features of the second electrically conductive line 417 and the gate insulation layer below the second electrically conductive line 417 may correspond to the features of the first electrically conductive line 416 and the gate insulation layer below the first electrically conductive line 416 described above.

The doping of a channel region of the second pull-up transistor 302 provided below the second electrically conductive line 417 may correspond to the N-type doping of the N-well region 402, and a source region 433 and a drain region 435 of the second pull-up transistor 302 may be P-doped. Channel regions of the pull-down transistors 309, 310 of the second pair 304 of pull-down transistors may be P-doped, in accordance with the P-type doping of the second P-well region 404, and source regions 438, 439 and drain regions 442, 443 of the pull-down transistors 309, 310 of the second pair 304 of pull-down transistors may be N-doped.

Gate electrodes of the access transistors 311, 312 of the first pair 305 of access transistors may be provided by electrically conductive lines 428, 429, and gate electrodes of the access transistors 313, 314 of the second pair 306 of access transistors may be provided by electrically conductive lines 430, 431. Similar to the first electrically conductive line 416 and the second electrically conductive line 417, the electrically conductive lines 428, 429, 430, 431 may be separated from the respective active regions above which they are formed by a gate insulation layer. Further features of the electrically conductive lines 428, 429, 430, 431 and the gate insulation layers associated therewith may correspond to those of the first and second electrically conductive lines 416, 417 and their gate insulation layers described above.

Channel regions of the access transistors 311, 312, 313, 314 may be P-doped, in accordance with the P-type doping of the first and second P-well regions 403, 404, and first source/drain regions 420, 421, 422, 423 and second source/drain regions 424, 425, 426, 427 of the access transistors 311, 312, 313, 314 may be N-doped.

The first access transistor 311 of the first pair 305 of access transistors and the first pull-down transistor 307 of the first pair 303 of pull-down transistors may be arranged adjacent each other along the longitudinal direction of the SRAM device 200. The active regions 411, 407 of these transistors may be contiguous. In particular, the first source/drain region 420 of the first access transistor 311 of the first pair 305 of access transistors and the drain region 440 of the first pull-down transistor 307 of the first pair 303 of pull-down transistors may be provided in the form of a contiguous N-doped area that is formed in the first P-well region 403. Thus, an electrical connection between the first source/drain region 420 of the access transistor 311 and the drain region 440 of the pull-down transistor 307 may be provided.

Similarly, the second access transistor 312 of the first pair 305 of access transistors and the second pull-down transistor 308 of the first pair 303 of pull-down transistors may be arranged adjacent each other along the longitudinal direction of the SRAM device 200. Active regions of the access transistor 312 and the pull-down transistor 308 may be contiguous. In particular, the first source/drain region 421 of the second access transistor 312 of the first pair 305 of access transistors and the drain region 441 of the second pull-down transistor 308 of the first pair 303 of pull-down transistors may be provided in the form of a contiguous N-doped area in the first P-well region 403. Thus, an electrical connection between the first source/drain region 421 of the access transistor 312 and the drain region 441 of the pull-down transistor 308 may be provided.

The active regions 411, 412 of the access transistors 311, 312 of the first pair 305 of access transistors are spaced apart along the width direction of the SRAM device 200. The SRAM device 200 may include an isolation region 415, wherein a portion of the isolation region 415 is arranged between the active regions 411, 412 of the access transistors 311, 312 of the first pair 305 of access transistors. Thus, the second source/drain regions 424, 425 of the access transistors 311, 312 are electrically insulated from each other. The isolation region 415 may be provided in the form of a trench isolation structure, for example a shallow trench isolation structure including an electrically insulating material such as, for example, silicon dioxide.

Another portion of the isolation structure 415 may be provided between the active regions 407, 408 of the pull-down transistors 307, 308 of the first pair 303 of pull-down transistors. Thus, the active regions 407, 408 of the first pull-down transistor 307 and the second pull-down transistor 308 of the first pair 303 of pull-down transistors are separated from each other and spaced apart along the width direction of the SRAM device 200.

A further portion of the isolation region 415 may be provided between the active regions 409, 410 of the pull-down transistors 309, 310 of the second pair 304 of pull-down transistors. Thus, the active regions 409, 410 of the pull-down transistors 309, 310 of the second pair 304 of pull-down transistors are separated from each other and spaced apart along the width direction of the SRAM device 200.

The first access transistor 313 of the second pair 306 of access transistors and the first pull-down transistor 309 of the second pair 304 of pull-down transistors are arranged adjacent each other along the longitudinal direction of the SRAM device 200. The active regions 409, 413 of the pull-down transistor 309 and the access transistor 313 may be contiguous. In particular, the first source/drain region 422 of the access transistor 313 and the drain region 442 of the pull-down transistor 309 may be provided in the form of a contiguous N-doped area in the second P-well region 404. Thus, an electrical connection between the first source/drain region 422 of the access transistor 313 and the drain region 442 of the pull-down transistor 309 may be provided.

The second pull-down transistor 310 of the second pair 304 of pull-down transistors and the second access transistor 314 of the second pair 306 of access transistors are arranged adjacent each other along the longitudinal direction of the SRAM device 200. The active regions 410, 414 of the pull-down transistor 310 and the access transistor 314 may be contiguous. In particular, the first source/drain region 423 of the access transistor 314 and the drain region 443 of the pull-down transistor 310 may be provided in the form of a contiguous N-doped area of the second P-well region 404. Thus, an electrical connection between the first source/drain region 423 of the access transistor 314 and the drain region 443 of the pull-down transistor 310 may be provided.

The active regions 413, 414 of the access transistors 313, 314 of the second pair 306 of access transistors may be spaced apart from each other, and separated from each other by a portion of the isolation region 415.

Further portions of the isolation region 415 may provide electrical insulation between the active regions 405, 406 of the pull-up transistors 301, 302, the active regions 412, 408 of the second access transistor 312 of the first pair 305 of access transistors and the second pull-down transistor 308 of the first pair 303 of pull-down transistors and the active regions 409, 413 of the first pull-down transistor 309 of the second pair 304 of pull-down transistors and the first access transistor 313 of the second pair 306 of access transistors. Additionally, electrical insulation between the circuit elements of the dual port SRAM cell 203 and circuit elements of other dual port SRAM cells of the SRAM device 200 which are adjacent the dual port SRAM cell 203 along the width direction of the SRAM device 200 may be provided by the isolation region 415.

The drain region 434 of the first pull-up transistor 301 may be electrically connected to the second electrically conductive line 417 and a first metallization line 418 by a contact structure 522. Thus, the electrical connection between the drain region 434 of the first pull-up transistor 301 and the gate electrodes of the second pull-up transistor 302 and the pull-down transistors 309, 310 of the second pair 304 of pull-down transistors may be provided.

Similarly, the drain region 435 of the second pull-up transistor 302 may be electrically connected to the first electrically conductive line 416 and a second metallization line 419 by a contact structure 523, so that the drain region 435 of the second pull-up transistor 302 is electrically connected to the gate electrodes of the pull-down transistors 307, 308 of the first pair 303 of pull-down transistors and the first pull-up transistor 301.

Additionally, the drain region 434 of the first pull-up transistor 301 may be electrically connected to the first source/drain regions 420, 421 of the access transistors 311, 312 of the first pair 305 of access transistors and the drain regions 440, 441 of the pull-down transistors 307, 308 of the first pair 303 of pull-down transistors by contact structures 520, 521, 522 and the first metallization line 418. Similarly, the drain region 435 of the second pull-up transistor 302 may be electrically connected to the first source/drain regions 422, 423 of the access transistors 313, 314 of the second pair 306 of access transistors and the drain regions 442, 443 of the pull-down transistors 309, 310 of the second pair 304 of pull-down transistors by contact structures 523, 524, 525 and the second metallization line 419.

Further contact structures may be provided for electrically connecting the circuit elements of the dual port SRAM cell 203 to the bitlines 210a, 211a, the inverse bitlines 212a, 213a, the wordlines 214a, 215a and the power source lines 207a, 208a, 209a.

In particular, a contact structure 510a may provide an electrical connection between the bitline 210a and the second source/drain region 424 of the first access transistor 311 of the first pair 305 of access transistors. A contact structure 511a may provide an electrical connection between the second source/drain region 425 of the second access transistor 312 of the first pair 305 of access transistors and the bitline 211a. Contact structure 514a may provide an electrical connection between the electrically conductive line 428 forming the gate electrode of the first access transistor 311 of the first pair 305 of access transistors and the wordline 214a, and a contact structure 515a may provide an electrical connection between the electrically conductive line 429 forming the gate electrode of the second access transistor 312 of the first pair 305 of access transistors and the wordline 215a.

Similarly, contact structures 512a and 513a provide an electrical connection between the second source/drain regions 426, 427 of the access transistors 313, 314 of the second pair 306 of access transistors and the inverse bitlines 212a, 213a. Contact structure 514'a and contact structure 515'a, respectively, provide electrical connections between the electrically conductive lines 430, 431, respectively, and the wordlines 214a and 215a, respectively.

Contact structures 508a and 508'a electrically connect the source regions 436, 437 of the pull-down transistors 307, 308 of the first pair 303 of pull-down transistors to the low voltage power source line 208a. Contact structures 509a, 509'a electrically connect the source regions 438, 439 of the pull-down transistors 309, 310 of the second pair 304 of pull-down transistors to the low voltage power supply line 209a.

Contact structures 507a, 507'a electrically connect the source regions 432, 433 of the pull-up transistors 301, 302 to the high voltage power supply line 207a.

The electrically conductive lines 416, 417, 428, 429, 430, 431 and the metallization lines 418, 419 may extend substantially parallel to the width direction of the SRAM device 200. Accordingly, all the electrically conductive lines 416, 417, 428, 429, 430, 431 and the all the metallization lines 418, 419 in the dual port SRAM cell 203 of the SRAM device 200 may be substantially straight and may extend in substantially the same direction. This may be of advantage from the point of view of manufacturing these structures by means of techniques of photolithography and etching.

The metallization lines 418, 419 and the various contact structures provided in the dual port SRAM cell 203 may be provided in the form of contact vias and trenches formed in an interlayer dielectric which are filled with an electrically conductive material, for example a metal. The bitlines 210a, 211a, 210b, 211b, inverse bitlines 212a, 213a, 212b, 213b, wordlines 214a, 215a, 214b, 215b, and power supply lines 207a, 208a, 209a, 207b, 208b, 209b may provided in the form of trenches formed in an interlayer dielectric which are filled with an electrically conductive material. A plurality of different interconnect levels stacked above each other may be provided.

The circuit layout of other dual port SRAM cells 204, 205, 206 in the SRAM device 200 may correspond generally to the circuit layout of the dual port SRAM cell 203 described above. However, the circuit layouts of adjacent dual port SRAM cells may be mirror-symmetrical with respect to each other. In particular, the dual port SRAM cell 204 may be mirror-symmetrical to the dual port SRAM cell 203, with an axis of symmetry that is parallel to the length direction of the SRAM device 200. The dual port SRAM cell 205 may be mirror-symmetrical to the dual port SRAM cell 203, and the dual port SRAM cell 206 may be mirror-symmetrical to the dual port SRAM cell 204, with an axis of symmetry that is parallel to the width direction of the SRAM device 200. Thus, contact structures 514a, 510a, 511a, 507'a, 509a, 509'a, 515'a, 513a, 512a, 507a, 508'a, 508a which are arranged at the edges of the dual port SRAM cells of the SRAM device 200 may be shared between adjacent dual port SRAM cells. Furthermore, the active regions 411, 412, 406, 409, 410, 407, 408, 405, 413, 414 may be contiguous with corresponding active regions in neighboring dual port SRAM cells in the same column of the array of dual port SRAM cells.

The isolation region 415, in particular the portions between the active regions 411, 412 of the access transistors 311, 312 of the first pair 305 of access transistors and between the active regions 407, 408 of the pull-down transistors 307, 308 of the first pair 303 of pull-down transistors may include elongated trench isolation structures extending through the columns of the array 202 of dual port SRAM cells along the longitudinal direction of the SRAM device 200. Similarly, the portions of the isolation region 415 between the active regions 409, 410 of the pull-down transistors 309, 310 of the second pair 304 of pull-down transistors and between the active regions 413, 415 of the access transistors 313, 314 of the second pair 306 of access transistors may include elongated trench isolation structures extending through the columns of dual port SRAM cells of the array 202 of dual port SRAM cells along the longitudinal direction of the SRAM device 200. This may be advantageous from the point of view of manufacturing the SRAM device 200. Further portions of the isolation region 415 may be provided between the active regions 407, 410, 411, 414 and the edges of the dual port SRAM cell 203 to provide electrical insulation between abutting cells.

Moreover, each of the active regions 411, 412, 413, 414 of the access transistors 311, 312, 313, 314 may have a similar environment, and each of active regions 407, 408, 409, 410 of the pull-down transistors 307, 308, 309, 310 may have a similar environment.

Therefore, deviations between the electrical parameters of the transistors of the dual port SRAM cells of the SRAM device 200 may be substantially avoided or at least reduced, while, due to the substantially straight shape of the electrically conductive lines and metallization lines, difficulties of the manufacturing process may be substantially avoided or at least reduced.

As shown in FIG. 4, the channel length directions of all the transistors of the dual port SRAM cell 203 extend substantially parallel to the longitudinal direction of the SRAM device 200, and the channel width directions of the transistors of the dual port SRAM cell 203 extend substantially parallel to the width direction of the SRAM device 200. The channel width of the pull-down transistors 307, 308, 309, 310 may be greater than the channel width of the access transistors 311, 312, 313, 314 and may be different from the channel width of the pull-up transistors 301, 302.

A gate length of each of the transistors of the dual port SRAM cells of the SRAM device 200 may be approximately 47 nm or less. Channel widths of the pull-down transistors 307, 308, 309, 310 may be approximately 386 nm or less, and channel widths of the access transistors 311, 312, 313, 314 may be approximately 158 nm or less. The contact structures of the dual port SRAM cells of the SRAM device 200 may have dimensions of approximately 40 nm or less. In other embodiments, for example in embodiments used in 20 nm technologies, different dimensions may be employed. Moreover, in some cases, the channel widths of the access transistors 311, 312, 313, 314 may be equal to or greater than the channel width of the pull-down transistors 307, 308, 309, 310, different from the relative dimensions of the channel widths shown in FIG. 4.

The above-described features may be formed by means of techniques employed in the manufacturing of SRAM devices. In particular, the N-well regions and P-well regions may be formed by means of ion implantation processes. During ion implantation processes performed for forming one of the N-well regions and the P-well regions, the other of the N-well regions and the P-well regions may be covered by a photoresist mask. Thereafter, the isolation structure 415 may be formed by means of techniques of forming shallow trench isolation structures in semiconductor devices including photolithography, etching, oxidation and deposition. Then, gate insulation layers and electrically conductive lines may be formed by forming layers of a gate insulation material and a material of the electrically conductive lines using processes of deposition and/or oxidation. Then, ion implantation processes may be formed for doping the source regions, drain regions and source/drain regions of the transistors in the dual port SRAM cells by implanting ions into the active regions of the transistors, wherein the electrically conductive lines can prevent an implantation of ions into the channel regions of the transistors. During the implantation of ions into the active regions of N-channel transistors, the P-channel transistors may be covered by a photoresist mask, and the N-channel transistors may be covered by a photoresist mask during the implantation of ions into the active regions of the P-channel regions. Then, the contact structures, metallization lines, bitlines, inverse bitlines, wordlines and power supply lines may be formed by depositing one or more layers of interlayer dielectric, forming trenches and contact vias therein, and filling the trenches and contact vias with an electrically conductive metal.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A device, comprising:
    a substrate comprising an N-well region, a first P-well region and a second P-well region, the first and second P-well regions being arranged on opposite sides of the N-well region and spaced apart along a width direction;
    a dual port static random access memory cell comprising a first pull-up transistor and a second pull-up transistor provided in said N-well region, a first pair of pull-down transistors and a first pair of access transistors provided in said first P-well region, and a second pair of pull-down transistors and a second pair of access transistors provided in said second P-well region;
    wherein each of said first pair of pull-down transistors and said second pair of pull-down transistors comprises a first pull-down transistor and a second pull-down transistor, wherein an active region of said first pull-down transistor and an active region of said second pull-down transistor are spaced apart along said width direction.

2. The device of claim 1, wherein an isolation region is provided between said active region of said first pull-down transistor and said active region of said second pull-down transistor of each of said first pair of pull-down transistors and said second pair of pull-down transistors.

3. The device of claim 2, wherein each of said first pair of access transistors and said second pair of access transistors comprises a first access transistor and a second access transistor, wherein an active region of said first access transistor and an active region of said second access transistor are electrically isolated from each other and spaced apart along said width direction.

4. The device of claim 3, further comprising:
    a first electrically conductive line comprising a gate electrode of each of said pull-down transistors of said first pair of pull-down transistors and said first pull-up transistor; and
    a second electrically conductive line comprising a gate electrode of each of said pull-down transistors of said second pair of pull-down transistors and said second pull-up transistor.

5. The device of claim 4, wherein each of said first electrically conductive line and said second electrically conductive line extends substantially parallel to said width direction.

6. The device of claim 5, further comprising:
    a first metallization line electrically connected to first source/drain regions of each of said access transistors of said first pair of access transistors, drain regions of each of said pull-down transistors of said first pair of pull-down transistors and a drain region of said first pull-up transistor; and a second metallization line electrically connected to first source/drain regions of each of said access transistors of said second pair of access transistors, drain regions of each of said pull-down transistors of said second pair of pull-down transistors and a drain region of said second pull-up transistor.

7. The device of claim 6, wherein each of said first metallization line and said second metallization line extends substantially parallel to said width direction.

8. The device of claim 7, further comprising:
a first bitline electrically connected to a second source/drain region of said first access transistor of said first pair of access transistors;
a second bitline electrically connected to a second source/drain region of said second access transistor of said second pair of access transistors;
a first inverse bitline electrically connected to a second source/drain region of said first access transistor of said second pair of access transistors;
a second inverse bitline electrically connected to a second source/drain region of said second access transistor of said second pair of access transistors;
a first wordline electrically connected to gate electrodes of each of said first access transistors of said first and said second pairs of access transistors; and
a second wordline electrically connected to gate electrodes of each of said second access transistors of said first and said second pairs of access transistors.

9. The device of claim 8, wherein said first and second bitlines and said first and second inverse bitlines extend substantially perpendicularly to said width direction, and wherein said first and second wordlines extend substantially parallel to said width direction.

10. The device of claim 9, wherein source regions of said first and second pull-up transistors are electrically connected to a first power supply line, wherein source regions of said pull-down transistors of said first pair of pull-down transistors are electrically connected to a second power supply line, wherein source regions of said pull-down transistors of said second pair of pull-down transistors are electrically connected to a third power supply line, and wherein each of said first, second and third power supply lines extends substantially perpendicularly to said width direction.

11. The device of claim 10, wherein a channel length direction of each transistor of said first and second pairs of access transistors, said first and second pairs of pull-down transistors and said first and second pull-up transistors is substantially perpendicular to said width direction.

12. The device of claim 11, wherein:
said first access transistor of said first pair of access transistors and said first pull-down transistor of said first pair of pull-down transistors are arranged adjacent each other along a longitudinal direction that is perpendicular to said width direction;
said second access transistor of said first pair of access transistors and said second pull-down transistor of said first pair of pull-down transistors are arranged adjacent each other along said longitudinal direction;
said first access transistor of said second pair of access transistors and said first pull-down transistor of said second pair of pull-down transistors are arranged adjacent each other along said longitudinal direction; and
said second access transistor of said second pair of access transistors and said second pull-down transistor of said second pair of pull-down transistors are arranged adjacent each other along said longitudinal direction.

13. The device of claim 12, wherein:
an active region of said first access transistor of said first pair of access transistors and an active region of said first pull-down transistor of said first pair of pull-down transistors are contiguous;
an active region of said second access transistor of said first pair of access transistors and an active region of said second pull-down transistor of said first pair of pull-down transistors are contiguous;
an active region of said first access transistor of said second pair of access transistors and an active region of said first pull-down transistor of said second pair of pull-down transistors are contiguous; and
an active region of said second access transistor of said second pair of access transistors and an active region of said second pull-down transistor of said second pair of pull-down transistors are contiguous.

14. The device of claim 13, wherein each access transistor of said first and second pairs of access transistors has substantially a first channel width and each pull-down transistor of said first and second pairs of pull-down transistors has substantially a second channel width, wherein said second channel width is greater than said first channel width.

15. A method, comprising:
providing a semiconductor substrate; and
forming a dual port static random access memory cell, wherein the formation of said dual port static random access memory cell comprises:
forming an N-well region, a first P-well region and a second P-well region in said substrate, wherein said first and second P-well regions are arranged on opposite sides of said N-well region and spaced apart along a width direction;
forming a first pull-up transistor and a second pull-up transistor in said N-well region;
forming a first pair of pull-down transistors and a first pair of access transistors in said first P-well region;
forming a second pair of pull-down transistors and a second pair of access transistors in said second P-well region;
wherein each of said first pair of pull-down transistors and said second pair of pull-down transistors comprises a first pull-down transistor and a second pull-down transistor, wherein an active region of said first pull-down transistor and an active region of said second pull-down transistor are spaced apart along said width direction.

16. The method of claim 15, further comprising forming an isolation region in said substrate, wherein portions of said isolation region are provided between said active region of said first pull-down transistor and said active region of said second pull-down transistor of each of said first pair of pull-down transistors and said second pair of pull-down transistors.

17. The method of claim 15, wherein the formation of said first and second pairs of pull-down transistors and said first and second pull-up transistors comprises:
forming a first electrically conductive line comprising a gate electrode of each of said pull-down transistors of said first pair of pull-down transistors and said first pull-up transistor; and
forming a second electrically conductive line comprising a gate electrode of each of said pull-down transistors of said second pair of pull-down transistors and said second pull-up transistor.

18. The method of claim 17, wherein each of said first electrically conductive line and said second electrically conductive line extends substantially parallel to said width direction.

19. The method of claim 18, wherein said first and second electrically conductive lines are substantially straight.

20. The method of claim 15, wherein:
- said first access transistor of said first pair of access transistors and said first pull-down transistor of said first pair of pull-down transistors are formed in a contiguous first active semiconductor region;
- said second access transistor of said first pair of access transistors and said second pull-down transistor of said first pair of pull-down transistors are formed in a contiguous second active semiconductor region, said first and said second contiguous active semiconductor regions being separated by a first trench isolation structure that extends substantially perpendicularly to said width direction;
- said first access transistor of said second pair of access transistors and said first pull-down transistor of said second pair of pull-down transistors are formed in a contiguous third active semiconductor region; and
- said second access transistor of said second pair of access transistors and said second pull-down transistor of said second pair of pull-down transistors are formed in a contiguous fourth active semiconductor region, said third and the fourth contiguous active semiconductor region being separated by a second trench isolation structure that extends substantially perpendicular to said width direction.

* * * * *